United States Patent [19]

Stahl

[11] 4,000,335
[45] Dec. 28, 1976

[54] METHOD OF MAKING PHOTOCATHODES

[75] Inventor: Herbert A. Stahl, Springfield, Va.

[73] Assignee: The United States of America as represented by the Secretary of the Army, Washington, D.C.

[22] Filed: Sept. 20, 1974

[21] Appl. No.: 507,837

[52] U.S. Cl. .................................. 427/74; 118/49; 204/26

[51] Int. Cl.$^2$ .................. C23C 13/08; C25D 7/04

[58] Field of Search ............... 204/26, 47, 46, 298, 204/192; 117/95, 50; 220/64; 118/49, 49.1; 427/248, 294

[56] References Cited

UNITED STATES PATENTS

| | | | |
|---|---|---|---|
| 2,256,771 | 9/1941 | Berghans | 204/298 |
| 2,929,766 | 3/1960 | Withers et al. | 204/34 |
| 3,314,873 | 4/1967 | Lunsford | 204/298 |
| 3,844,924 | 10/1974 | Cunningham | 204/298 |

FOREIGN PATENTS OR APPLICATIONS 560 1882 United Kingdom ................. 204/26

*Primary Examiner*—T. M. Tufariello
*Attorney, Agent, or Firm*—Nathan Edelberg; John E. Holford; Robert P. Gibson

[57] ABSTRACT

A method is provided for making photocathodes which uses a stainless steel high-vacuum, or ultrahigh vacuum, manifold fitted with side-tubulations and appertenances, and having interior surfaces that are coated or plated with a noble metal or semi-noble metal layer, in order to assure most extreme cleanliness within the vacuum system.

4 Claims, 2 Drawing Figures

METHOD OF MAKING PHOTOCATHODES

The invention described herein may be manufactured, used, and licensed by or for the Government for governmental purposes without the payment to me of any royalty thereon.

BACKGROUND OF THE INVENTION

In basic and applied research, stainless steel manifolds and implements are used increasingly for high vacuum, and ultra-high vacuum apparatuses. Depending on the cleanliness and vacuum to be achieved bake-out is a requisite, and a well known routine procedure in this art. The temperature necessary varies from 200° to 400° centigrade depending on the most heat-sensitive material within the vessel. Above approximately 300° the stainless steel wall material, usually type S-304 begins to oxidize when exposed to atmospheric air, as evidenced by a gradually deepening yellow surface tint of the manifold.

This superficial, and external, oxidation of stainless steel does not impair the proper functioning of the manifold, and attached implements. However, the internal surface that faces and surrounds the assay to be investigated may exert a marked impact on that assay. Stainless steel is basically an alloy of iron, chromium and nickel that also contains carbon in the form of graphite, up to two percent of manganese, one percent silicon, and last but not least contaminants such as phosphorus and sulfur. While all the basic constituents of stainless steel exhibit, at any temperature, vapor pressures of roughly the same order of magnitude, respectively. For reasons that will become evident, such constituents will be disregarded in this disclosure. In contrast, the vapor pressure of manganese is three orders of magnitude higher than that of iron, chromium or nickel while phosphorous and sulfur are, about 10–15 orders of magnitude higher at the same temperature.

The above facts show that the use of high vacuum and especially ultra-high vacuum manifolds made of commercially available stainless steel represents a distinct hazard to ultra-clean processing of solid state samples or assays. One example of such a sample is a photocathode which is made from very pure semiconductor materials. It is well known that assays of the materials sold for research programs on the above devices run to purities of 99.999 percent or better. The addition of a few parts per million from some of the contaminates mentioned above cause measureable modifications in the electrical properties of the product devices.

SUMMARY OF THE INVENTION

The object of the present invention is to provide a method of making photocathodes and like devices using a super-clean high, or ultra-high vacuum compartment or manifold made from stainless steel. It can be kept free from even the most minute traces of sulphur or phosphorus by coating or plating the internal surface of the manifold with a layer of a suitable noble metal, such as one from the platinum group of the Periodic System, (with the exception of palladium), gold, or a high melting point metal. A manifold according to the present invention can be employed for depositions of materials from reactive gases, vapors, or mixtures of both.

BRIEF DESCRIPTION OF THE DRAWINGS

The foregoing, and related objectives of the invention will be best understood with reference to the accompanying drawings wherein.

DESCRIPTION OF THE INVENTION

Figure 1:
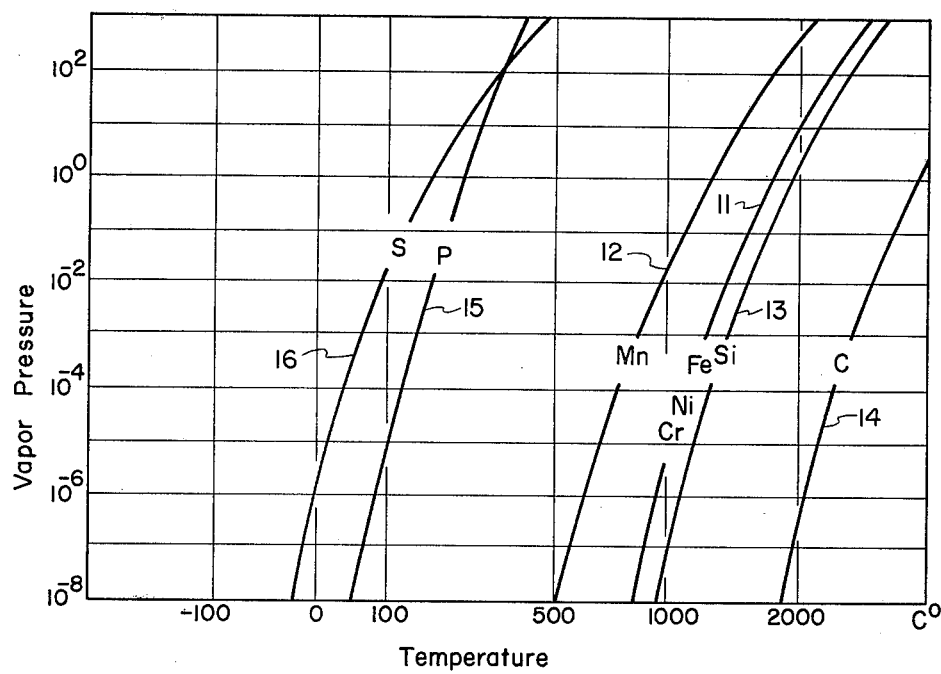
FIG. 1 shows a plot of vapor pressures vs temperature for the most common constituents and impurities found in stainless steel.

FIG. 1 shows a plot of the vapor pressures versus temperature of most metals and metaloids involved in the present invention. Curve 11 represents the vapor pressure curve of the basic constituents of stainless steel. Curve 12 refers to manganese which is usually the next most abundant constituent in stainless steel alloys. Analogously, curve 13 refers to silicon and curve 14 to carbon. It is readily seen that the vapor pressure of sulphur and phosphorus is at any temperature tremendously larger than those of the basic alloy constituents of stainless steel, including even manganese. Since the two aforementioned highly reactive elements are continuously diffusing to the surface of a heated stainless steel manifold during bake-out, its implementation alone is not sufficient to preserve the extreme purity of an originally uncontestable assay placed therein. The approach taken in the present invention is to provide a barrier layer at the inner surface, so that sulfur and phosphor diffused atoms cannot emanate into the vacuum. It is to be emphasized that the cladding according to the invention is absolutely free from the contaminants referred to above.

Figure 2:
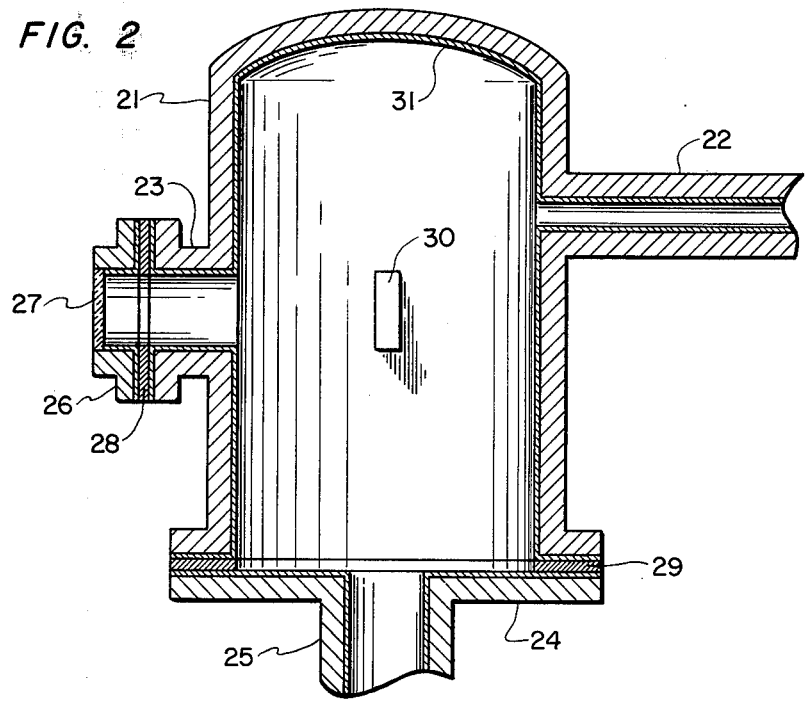
FIG. 2 shows a typical vacuum manifold used in processing solid state electronic components.

FIG. 2 shows a side view in section of an ultra-high vacuum manifold according to the present invention. The unit consists of a main, open ended housing member 21 having a side tabulation 22 for introducing preselected gases or vapors, and an observation port 23. The open end of the housing member is closed during operation of the unit by a base plate 24 fitted with an exhaust tubulation 25. The observation port is closed by a frame member 26 surrounding a hermetically sealed window 27. The frame member and the base plate include appropriate copper ring seals 28 and 29. The photocathode base material or similar sample is carried within the housing by means of a stainless steel support (not shown), which for purposes of this invention may be considered to be an extension of the inner wall surfaces of the housing member 21.

The emanation of phosphorus and sulphur into the high vacuum or ultra-high vacuum compartment of manifold can be prevented by a coating or plating 31 on the interior surface of the vessel, as well as any adjoining side tubulations. The coating preferably consisting of noble metals such as platinum, osmium, iridium or gold. The vapor pressures curves of the metals of the platinum group (except palladium) are roughly midway between those of silicon and carbon, i.e. they are lower by several orders of magnitude than those of the basic constituents of stainless steel. The contrary is true for gold (though not to a serious degree). Silver with a vapor pressure over four orders of magnitude greater at any temperature than iron is not considered to be a suitable metal for the purposes of this invention. Palladium is excluded from this invention because of its high gas-absorbing properties. Typical semi-noble metals such as columbium (niobium) rhenium tantalum, titanium, vanadium or zirconium can also be employed in this effort of preventing the entry of sulphurous or phosphorous vapors into the supposedly super-clean, ultra-high vacuum chamber.

The thickness of the coating can vary from millimicrons up to several microns. The effectiveness depends on the percentage of the total surface covered. Ideally, the entire inner surface is coated including the portions that extend under seals 38 and 29, and the seals are either made of non-contaminating, elastic materials such as copper or are coated in like manner. Inherently many variations of the above teachings will be obvious to those skilled in the art, but the present invention is limited only as specified in the claims which follow.

I claim:
1. The method of forming a photocathode, which consists of a number of materials deposited solely by evaporation of said materials onto a solid state sample having a purity of the order of 99.999 percent, wherein: said evaporation is performed in a stainless steel vacuum chamber coated on all of its interior surfaces with a noble metal having a vapor pressure higher than that of manganese and wherein the noble metal is different from said materials deposited onto said sample.

2. The method according to claim 1 wherein said noble metal is chosen from a group consisting of platinum, iridium, osmium, ruthenium, or rhodium.

3. The method according to claim 1 wherein said noble metal is chosen from a group consisting of columbium (niobium), rhenium, tantalum, titanium, vanadium or zirconium.

4. The method according to claim 1 wherein said noble metal is chosen from a group consisting of an alloy free from sulphur and phosphorus.

* * * * *